(12) United States Patent
Yuan et al.

(10) Patent No.: US 8,809,184 B2
(45) Date of Patent: Aug. 19, 2014

(54) METHODS OF FORMING CONTACTS FOR SEMICONDUCTOR DEVICES USING A LOCAL INTERCONNECT PROCESSING SCHEME

(75) Inventors: Lei Yuan, Sunnyvale, CA (US); Jin Cho, Palo Alto, CA (US); Jongwook Kye, Pleasanton, CA (US); Harry J. Levinson, Saratoga, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 35 days.

(21) Appl. No.: 13/465,633

(22) Filed: May 7, 2012

(65) Prior Publication Data
US 2013/0295756 A1 Nov. 7, 2013

(51) Int. Cl.
H01L 21/762 (2006.01)
H01L 21/768 (2006.01)
H01L 21/8238 (2006.01)
H01L 21/441 (2006.01)
H01L 23/535 (2006.01)

(52) U.S. Cl.
USPC ........... 438/618; 438/622; 438/687; 438/688; 438/745; 438/199; 438/621; 257/E21.585; 257/E29.255

(58) Field of Classification Search
CPC ................................................ H01L 21/76895
USPC ........................................................ 438/618
See application file for complete search history.

(56) References Cited

U.S. PATENT DOCUMENTS

| | | | |
|---|---|---|---|
| 4,978,637 A | 12/1990 | Liou et al. | |
| 5,075,761 A | 12/1991 | Liou et al. | |
| 5,081,518 A | 1/1992 | El-Diwany et al. | |
| 5,082,796 A | 1/1992 | El-Diwany et al. | |
| 5,124,280 A | 6/1992 | Wei et al. | |
| 5,668,409 A * | 9/1997 | Gaul | 257/723 |
| 5,831,899 A | 11/1998 | Wang et al. | |
| 6,100,128 A | 8/2000 | Wang et al. | |
| 6,531,735 B1 * | 3/2003 | Kamigaki et al. | 257/324 |
| 2003/0156460 A1 * | 8/2003 | Wu | 365/185.33 |
| 2003/0201490 A1 | 10/2003 | Burbach | |
| 2008/0217789 A1 * | 9/2008 | Kim | 257/774 |
| 2011/0127589 A1 * | 6/2011 | Chen et al. | 257/288 |
| 2013/0175583 A1 * | 7/2013 | Yuan et al. | 257/288 |

* cited by examiner

*Primary Examiner* — Colleen Matthews
*Assistant Examiner* — Regan J Rundio
(74) *Attorney, Agent, or Firm* — Amerson Law Firm, PLLC

(57) ABSTRACT

One method disclosed herein includes forming a plurality of source/drain contacts that are conductively coupled to a source/drain region of a plurality of transistor devices, wherein at least one of the source/drain contacts is a local interconnect structure that spans the isolation region and is conductively coupled to a first source/drain region in a first active region and to a second source/drain region in a second active region, and forming a patterned mask layer that covers the first and second active regions and exposes at least a portion of the local interconnect structure positioned above an isolation region that separates the first and second active regions. The method further includes performing an etching process through the patterned mask layer to remove a portion of the local interconnect structure, thereby defining a recess positioned above a remaining portion of the local interconnect structure, and forming an insulating material in the recess.

14 Claims, 10 Drawing Sheets

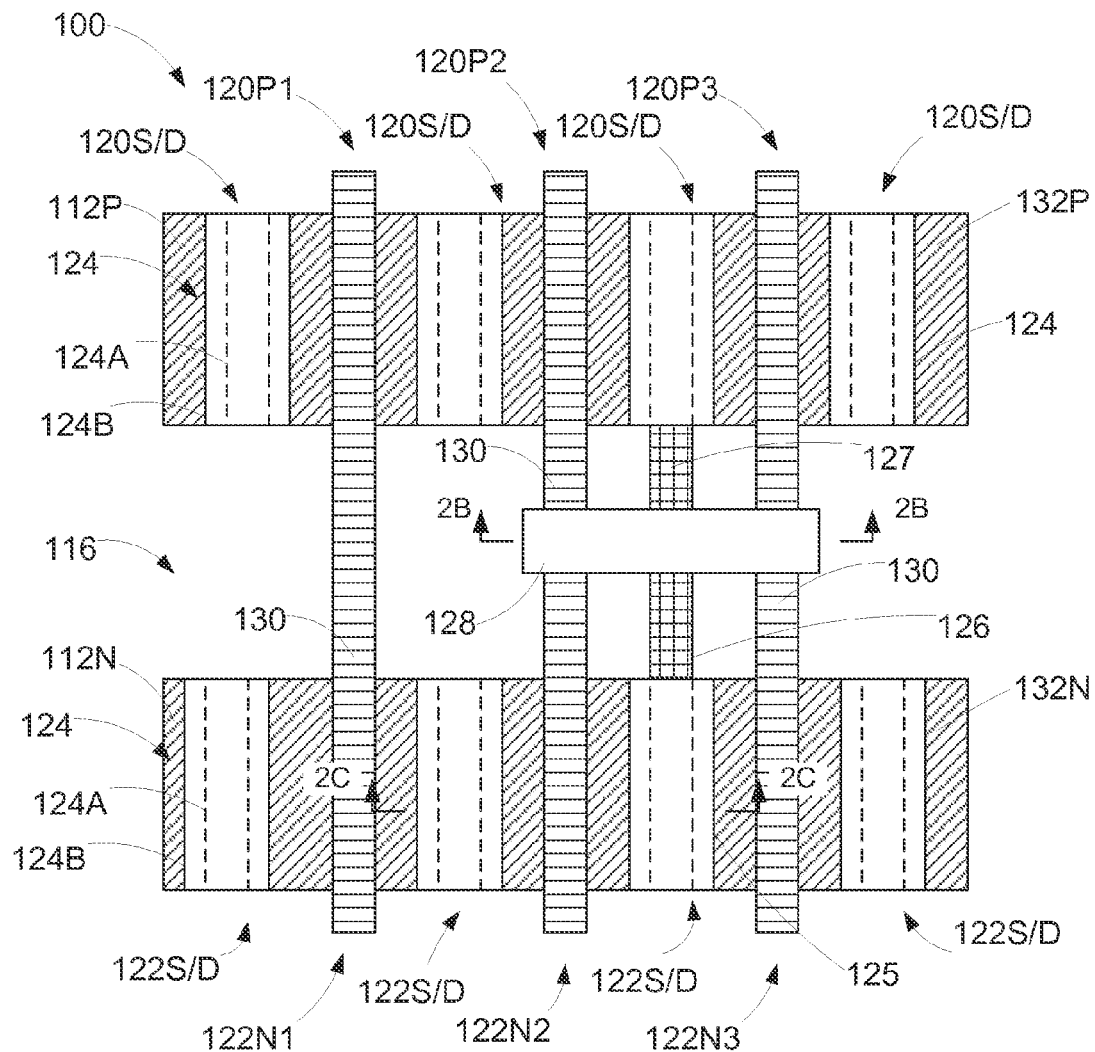
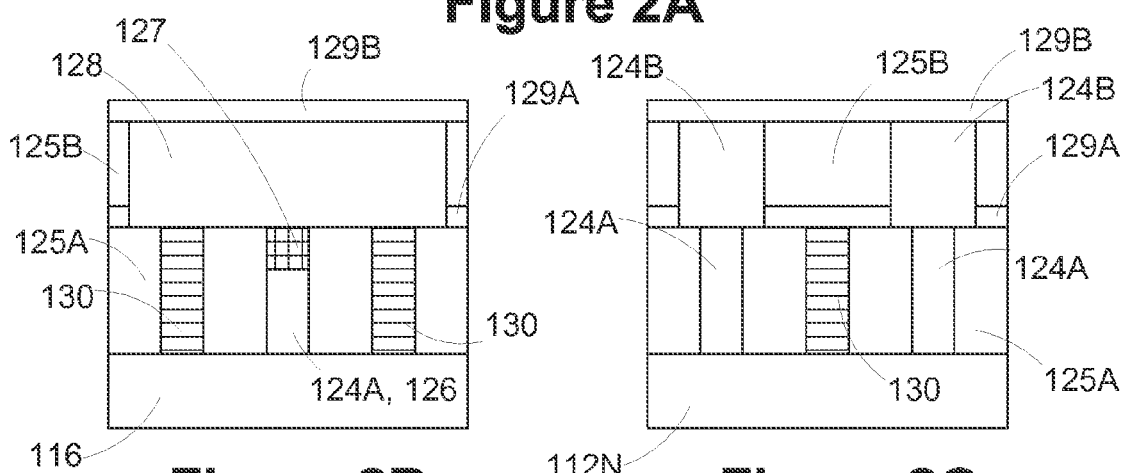
Figure 2A
Figure 2B
Figure 2C

US 8,809,184 B2

METHODS OF FORMING CONTACTS FOR SEMICONDUCTOR DEVICES USING A LOCAL INTERCONNECT PROCESSING SCHEME

BACKGROUND OF THE INVENTION

1. Field of the Invention

Generally, the present disclosure relates to the manufacture of sophisticated semiconductor devices, and, more specifically, to various methods of forming conductive contacts for semiconductor devices using a local interconnect processing scheme.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (FETs) represent one important type of circuit element that substantially determines performance of the integrated circuits. Field effect transistors are typically either NFET devices or PFET devices. During the fabrication of complex integrated circuits, millions of transistors, e.g., NFET transistors and/or PFET transistors, are formed on a substrate including a crystalline semiconductor layer. A field effect transistor, irrespective of whether an NFET transistor or a PFET transistor is considered, typically comprises so-called PN junctions that are formed by an interface of highly doped regions, referred to as drain and source regions, with a slightly doped or non-doped region, referred to as a channel region, disposed between the highly doped source/drain regions. The channel length of a transistor is generally considered to be the lateral distance between the source/drain regions. As device dimensions have continued to shrink over recent years, it is becoming more challenging to accurately and repeatedly manufacture integrated circuit products that meet performance criteria established for such integrated circuit products.

FIGS. 1A-1B schematically depict various portions and features of an illustrative prior art device 10. As shown therein, a plurality of spaced apart active regions 12P and 12N are defined in a semiconducting substrate by one or more isolation structures 16. A plurality of PFET devices 20P1-3 are formed in and above the active region 12P and a plurality of NFET devices 22N1-3 are formed in and above the active region 12N. The PFET devices comprise P-doped source/drain regions 20S/D while the NFET devices comprise N-doped source/drain regions 22S/D. In the depicted example, the various PFET and NFET devices share a common electrode structure 30 that extends across the separated active regions 12P, 12N and the isolation region 16 therebetween. For example, PFET transistor 20P1 and NFET transistor 22N1 share a common gate electrode structure 30 that extends across both of the active regions 12P, 12N and the isolation region 16 between those two active regions.

Still with continuing reference to FIGS. 1A-1B, the device 10 further comprises a plurality of source/drain contacts 24 that are conductively coupled to the source/drain regions of the various transistors. The device level contacts 24 may also be referred to as "trench silicide" regions within the industry. The device level contacts 24 are positioned in a layer of insulating material, which is not shown in FIGS. 1A-1B to facilitate explanation. At least one of the device level contacts 24 serves as a local interconnect structure 26 that spans across the isolation region 16 and conductively couples source/drain regions on the two isolated active regions 12P, 12N. An illustrative gate contact 28 that is conductively coupled to one of the gate structures 30 is also depicted in FIGS. 1A-1B.

With each new technology generation, virtually all dimensions of various features of an integrated circuit product are typically reduced. For example, as device dimensions are reduced, the lateral spacing 32 between the gate contact 28 and the local interconnect structure 26 had decreased. In some cases, the lateral spacing 32 may be as little as about 10 nm. As this lateral spacing decreases, there is an increased risk of creating short circuits. Of course, one way to rectify this problem would be to simply increase the spacing between adjacent transistors. However, such an approach would be very costly in terms of the plot space on the device that is lost and would run counter to the trend in integrated circuit products of reducing the size of such products.

The present disclosure is directed to various methods of forming conductive contacts for semiconductor devices using a local interconnect processing scheme that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive contacts for semiconductor devices using a local interconnect processing scheme. One illustrative method disclosed herein includes forming a plurality of source/drain contacts that are each conductively coupled to a source/drain region of a plurality of transistor devices, wherein at least one of the source/drain contacts is a local interconnect structure that spans the isolation region and is conductively coupled to a first source/drain region in a first active region and to a second source/drain region in a second active region, and forming a patterned mask layer that covers the first and second active regions and exposes at least a portion of the local interconnect structure positioned above an isolation region that separates the first and second active regions. The method further includes the steps of performing an etching process through the patterned mask layer to remove a portion of the local interconnect structure, which thereby defines a recess positioned above a remaining portion of the local interconnect structure, and forming an insulating material in the recess. In one illustrative example, the source/drain contacts are dual level source/drain contacts that are each comprised of a lower level source/drain contact and an upper level source/drain contact that is conductively coupled to the lower level source/drain contact. In such an illustrative example, at least one of the lower level source/drain contacts serves as the local interconnect structure that spans the isolation region.

Another illustrative method disclosed herein includes forming a plurality of dual level source/drain contacts that are each conductively coupled to a source/drain region of one of the plurality of transistor devices, wherein each of the dual level source/drain contacts is comprised of a lower level source/drain contact and an upper level source/drain contact that is conductively coupled to the lower level source/drain contact, wherein at least one of the lower level source/drain contacts is a local interconnect structure that spans the isolation region and is conductively coupled to a first source/drain region in the first active region and to a second source/drain region in the second active region, and forming a patterned mask layer that covers the first and second active regions and exposes at least a portion of the local interconnect structure positioned above an isolation region that separates the first and second active regions. The method further includes the steps of performing an etching process through the patterned mask layer to remove a portion of the local interconnect structure, which thereby defines a recess positioned above a remaining portion of the local interconnect structure, forming an insulating material in the recess and forming a gate contact that is conductively coupled to at least one gate electrode of the plurality of transistor devices, wherein at least a portion of the gate contact is positioned above the insulating material in the recess that is positioned above the remaining portion of the local interconnect structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2C are various views of an illustrative semiconductor device wherein conductive contacts have been formed for the device using a local interconnect processing scheme disclosed herein.

Figure 1A:
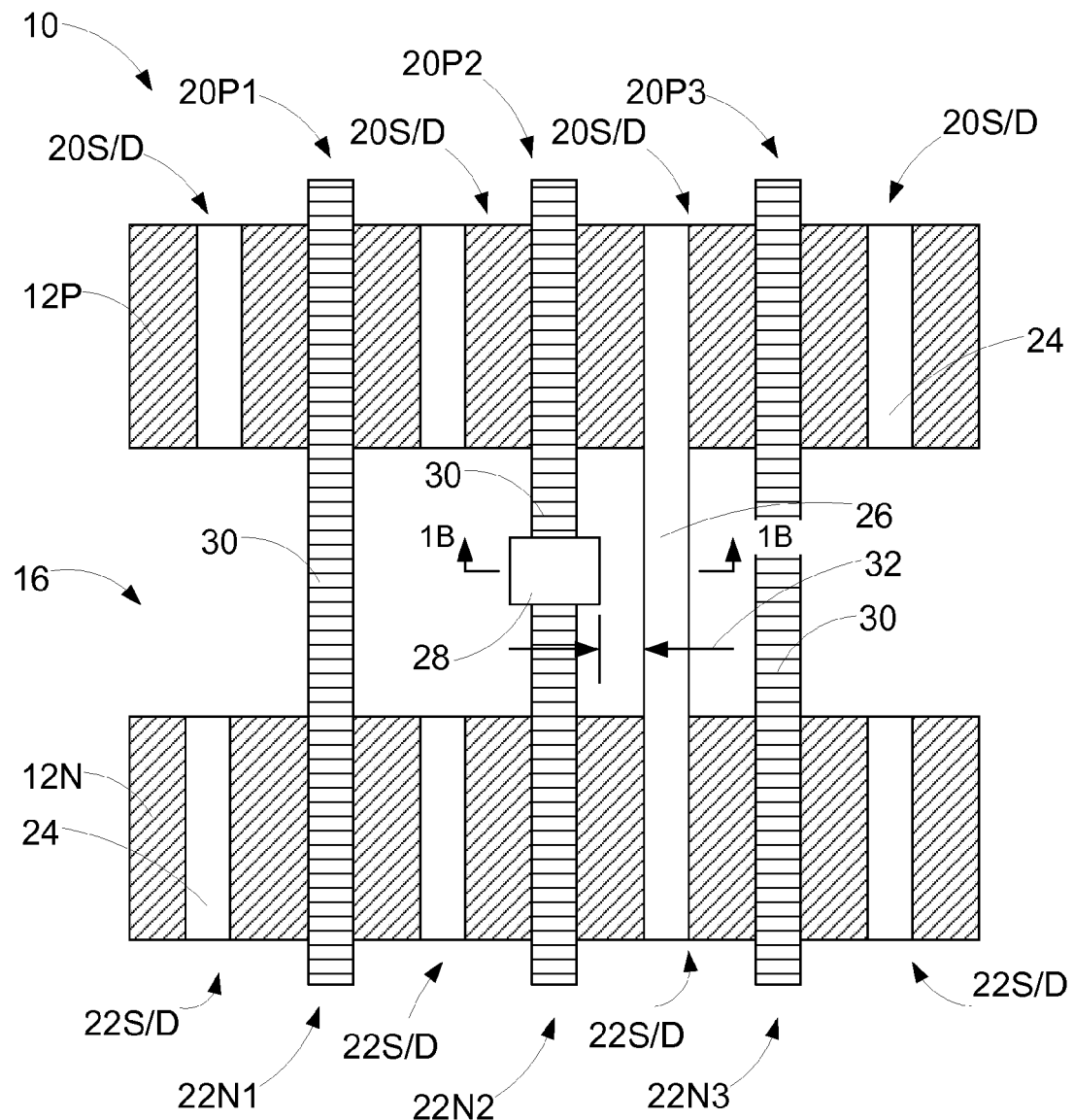
FIGS. 1A-1B depict illustrative examples of the arrangement of conductive contacts in one illustrative prior art semiconductor device.
Figure 1B:
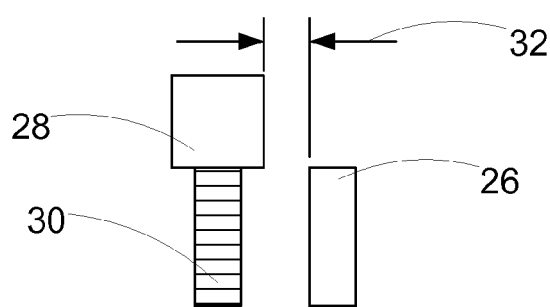

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed various methods of forming conductive contacts for semiconductor devices using a local interconnect processing scheme. As will be readily apparent to those skilled in the art upon a complete reading of the present application, the presently disclosed subject matter may be used with a variety of different devices and technologies, e.g., NFET, PFET, CMOS, etc., and it may be readily employed on a variety of integrated circuit products, including, but not limited to, ASIC's, logic devices, memory devices, etc. With reference to the attached drawings, various illustrative embodiments of the devices and methods disclosed herein will now be described in more detail.

FIG. 2A-2C are various schematic drawings that explain certain aspects of the various devices disclosed herein. As shown in FIG. 2A, an illustrative device 100 comprises a first active region 112P and a second active region 112N formed in a semiconducting substrate. The active regions 112P, 112N are defined in the semiconducting substrate by an isolation structure 116, e.g., silicon dioxide, that may be formed using traditional techniques. The substrate may take the form of a silicon-on insulator (SOI) substrate that is comprised of a bulk substrate, a buried insulation layer (a so-called BOX layer) and an active layer positioned above the box layer. In such an embodiment, the active regions 112P, 112N would be formed in the active layer. The substrate may also be in bulk form. The substrate may also be made of materials other than silicon. Thus, the terms substrate or semiconducting substrate as used herein and in the appended claims should not be considered as limited to any particular configuration or material.

With continuing reference to FIG. 2A, a plurality of PFET devices 120P1-3 are formed in and above the active region 112P and a plurality of N-FET devices 122N1-3 are formed in and above the active region 112N. The PFET devices 120 and the NFET devices 122 may be formed using traditional materials and techniques. For example, the PFET devices 120 may be comprised of various P-doped regions 132P, e.g., P-doped source/drain regions, and the NFET devices 122 may be comprised of various N-doped regions 132N. In the depicted example, the device 100 comprises a plurality of common gate structures 130 that are shared by the various PFET devices 120 and NFET devices 122. The common gate structures 130 are positioned above both of the active regions 112P, 112N and they each span the isolation material 116 positioned between the active regions 112P, 112N. As will be appreciated by one skilled in the art after a complete reading of the present application, the gate structures 130 may be formed using a variety of different materials and by performing a variety of known techniques. For example, the gate insulation layer in such a gate structure 130 may be comprised of a variety of different insulating materials, e.g., silicon dioxide, a so-called high-k insulating material (k value greater than 10), etc. The gate electrode in such a gate structure 130 may be comprised of polysilicon or it may contain at least one metal layer. The gate structures 130 of the device 100 may be made using so-called "gate first" or "gate last" techniques. Thus, the presently disclosed inventions should not be considered as limited to any particular materials of construction for the gate structures 130 nor the manner in which such a gate structure 130 is formed.

FIGS. 2B and 2C are cross-sectional views taken where indicated in FIG. 2A. With reference to these drawings, the device 100 further comprises a plurality of dual level source/drain contacts 124 that are conductively coupled to the source/drain regions of the various transistors. In the depicted example, the dual level source/drain contacts 124 are comprised of a lower level source/drain contact 124A and an upper level source/drain contact 124B. The lower level source/drain contact 124A may also be referred to as "trench silicide" regions within the industry. The dual level source/drain contacts 124 are positioned in various layers of insulating material, which are not shown in FIG. 2A to facilitate explanation of the various inventions disclosed herein. For example, the device 100 may be provided with dielectric layers 125A, 125B made of an insulating material such as silicon dioxide, and dielectric layers 129A, 129B made of an insulating material such as silicon nitride. At least one of the lower level source/drain contacts 124A serves as a local interconnect structure 126 that spans across the isolation region 116 and conductively couples the two isolated active regions 112P, 112N. In one illustrative embodiment, an insulating material 127 is formed above the portion of the lower level source/drain contact 124A that is positioned above the isolation region 116.

Also depicted in FIGS. 2A-2C is one illustrative gate contact 128. Within the industry, the upper level source/drain contact 124B may also be referred to as "CA" contacts, while the gate contact 128 may be referred to as "CB" contacts. In the depicted example, the gate contact 128 is positioned in the layer of insulating material 125B. Each of the upper level source/drain contacts 124B is conductively coupled to the lower level source/drain contact 124A, while the gate contact 128 is conductively coupled to the gate electrode of the gate structure 130.

Figure 3A:
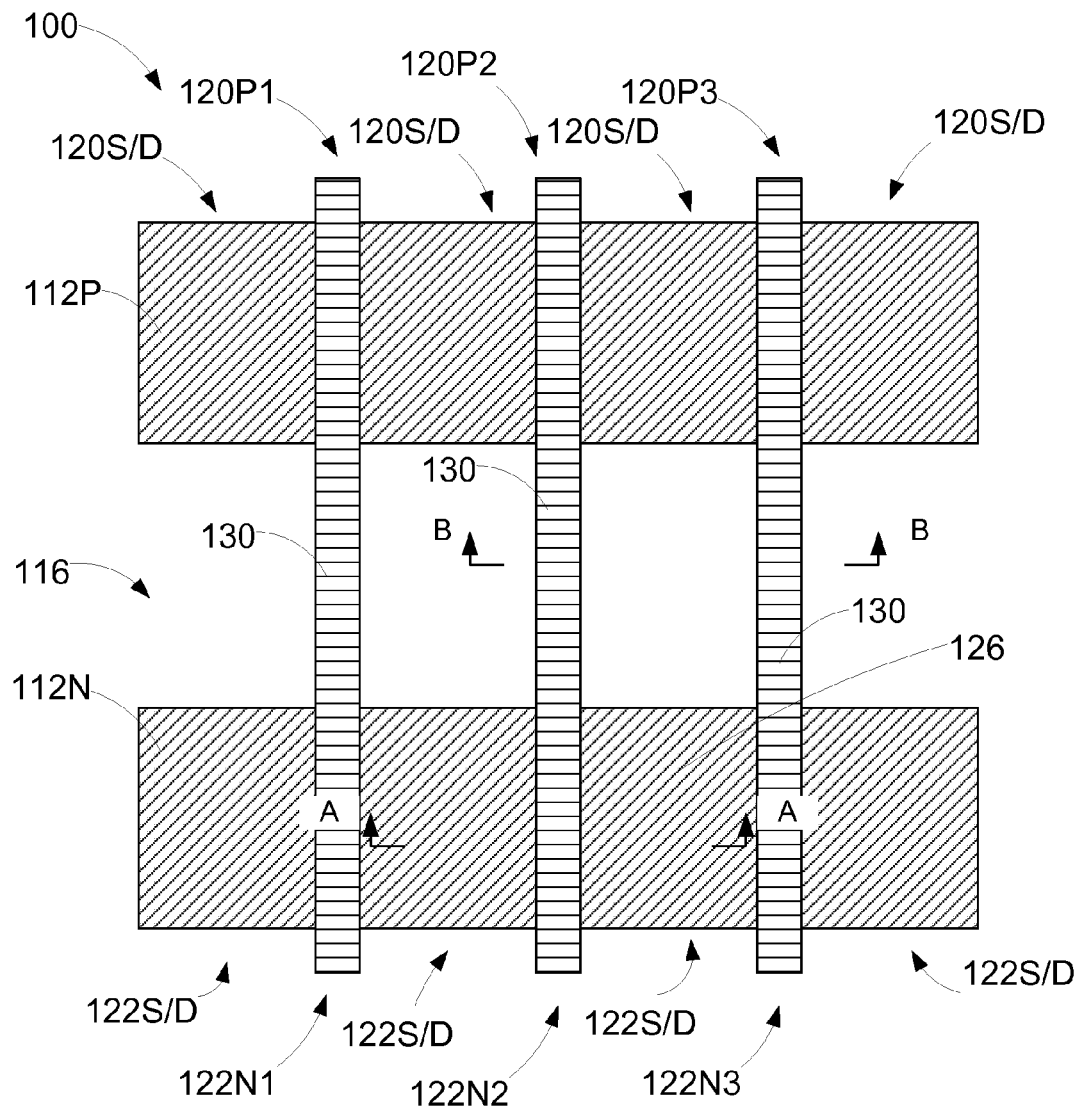
FIGS. 3A-3O depict one illustrative process flow disclosed herein for forming conductive contacts for semiconductor devices using a local interconnect processing scheme disclosed herein.
Figure 3B:
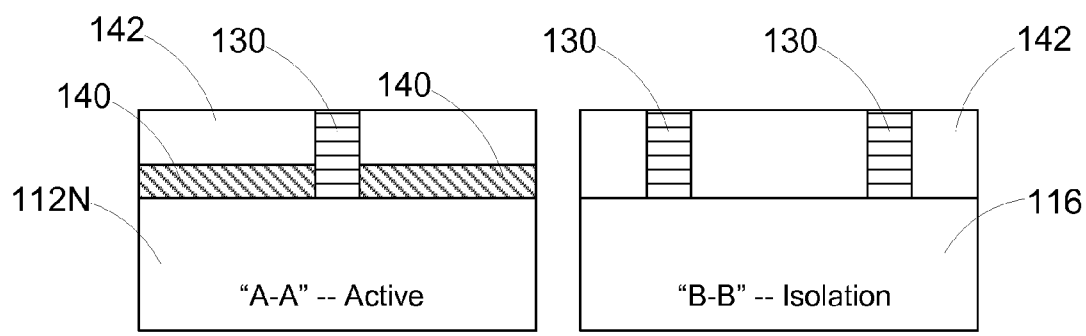
Figure 3C:
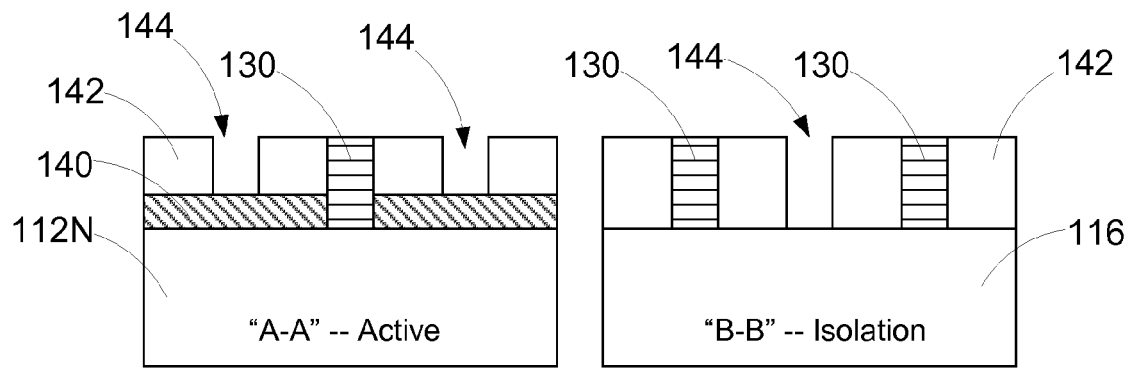
Figure 3D:
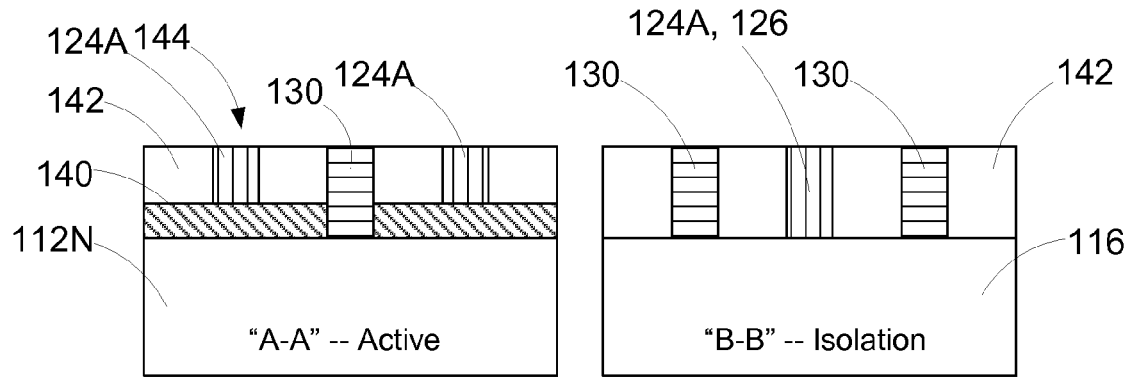
Figure 3E:
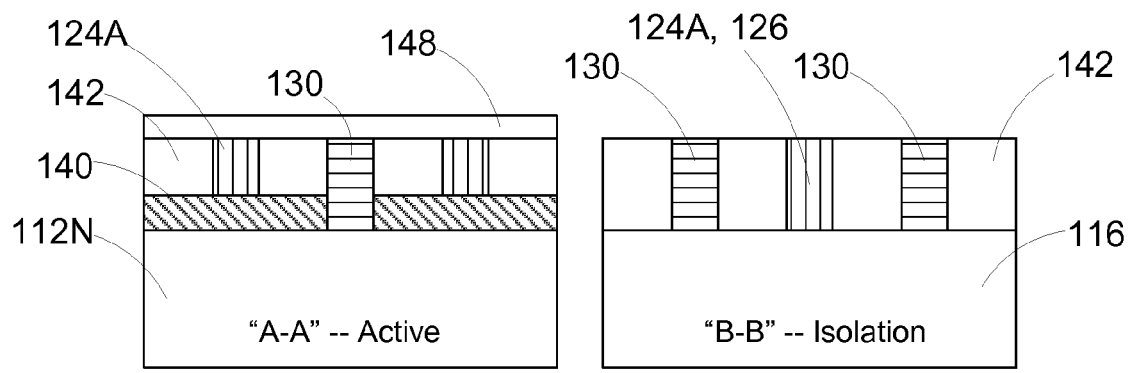
Figure 3F:
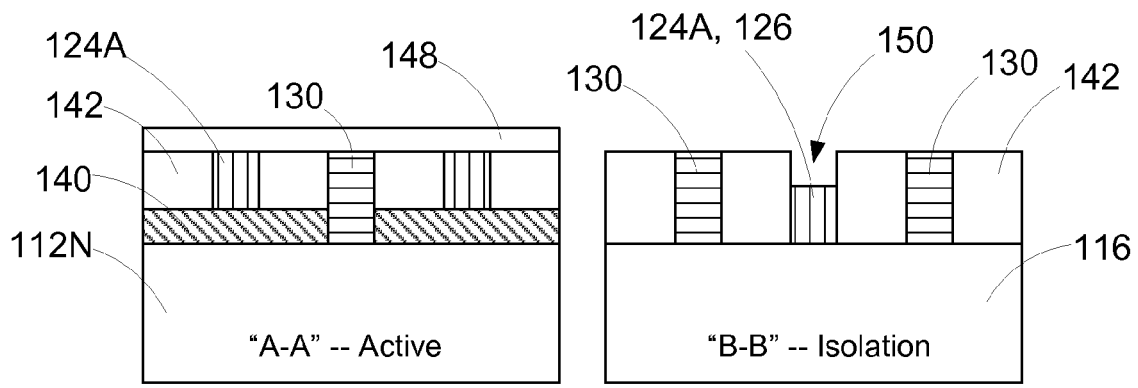
Figure 3G:
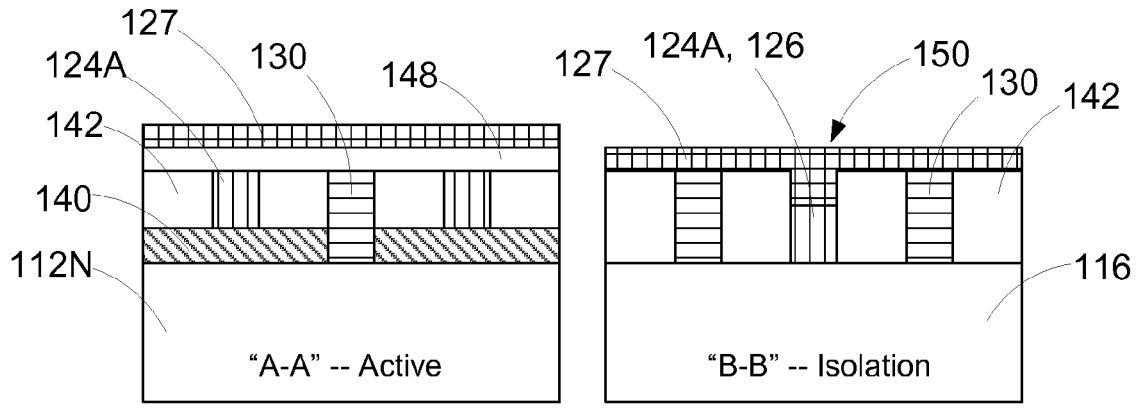
Figure 3H:
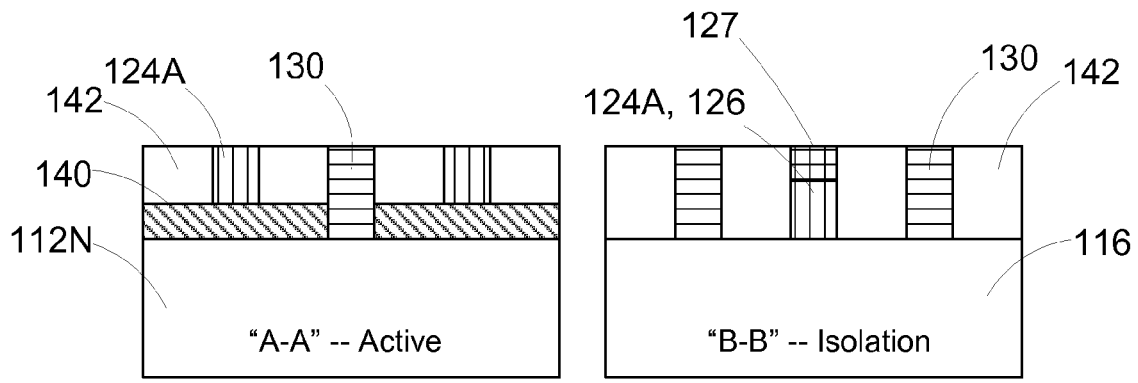
Figure 3I:
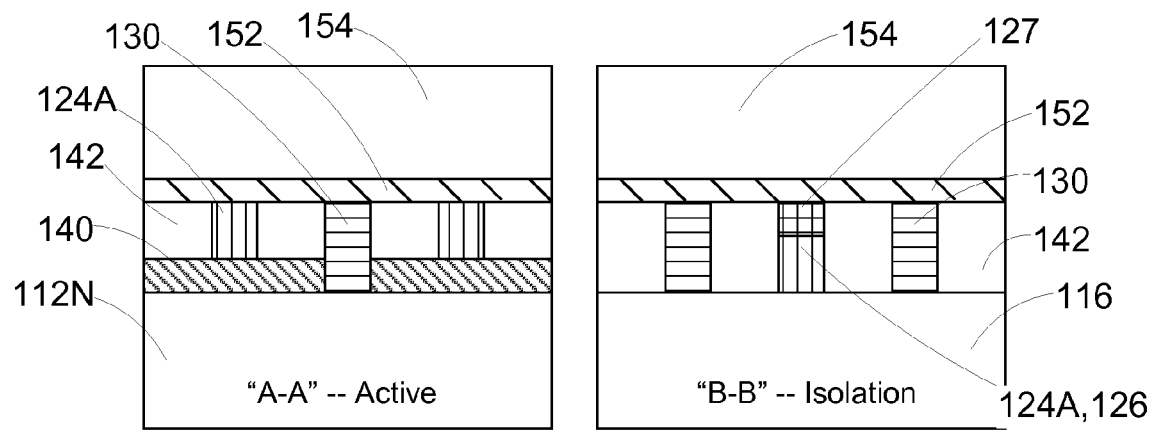
Figure 3J:
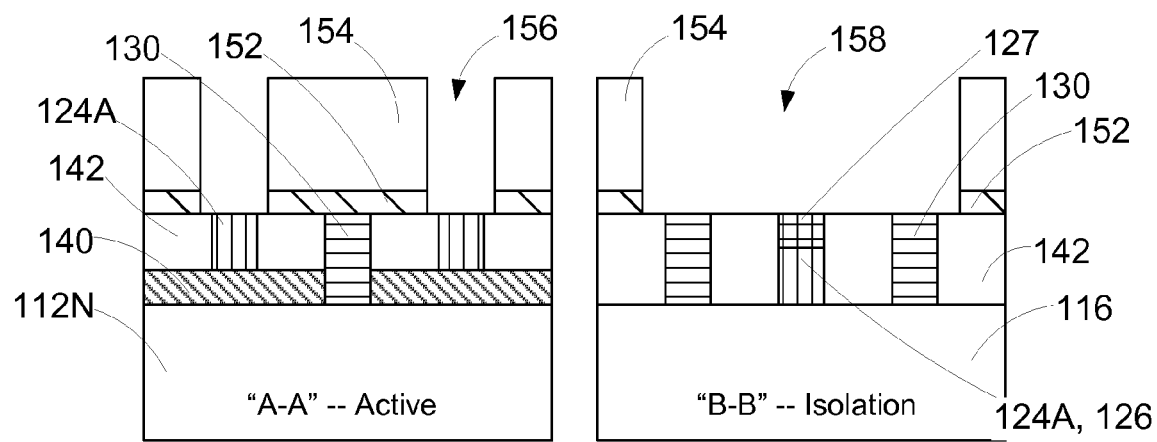
Figure 3K:
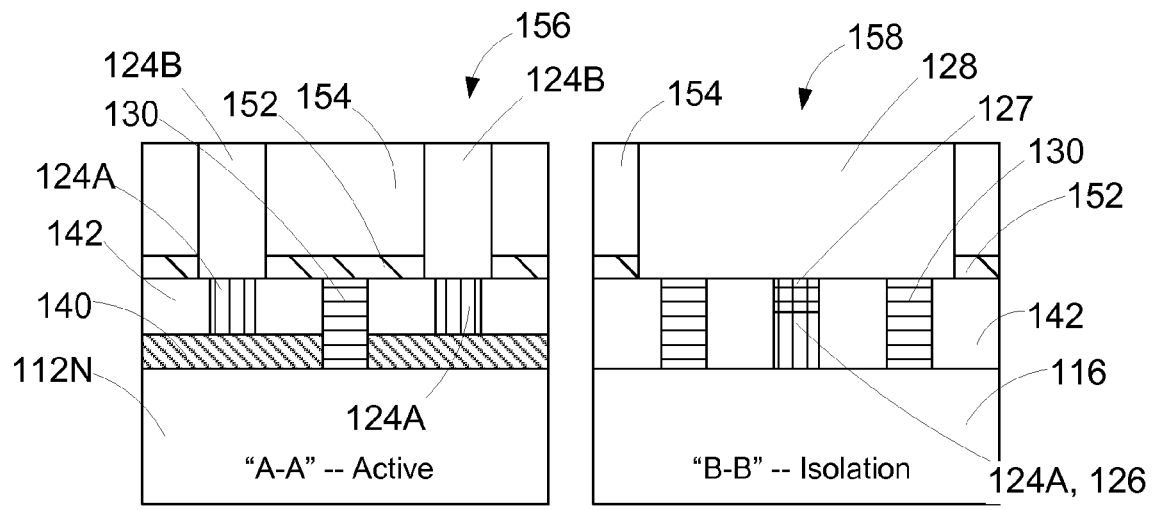
Figure 3L:
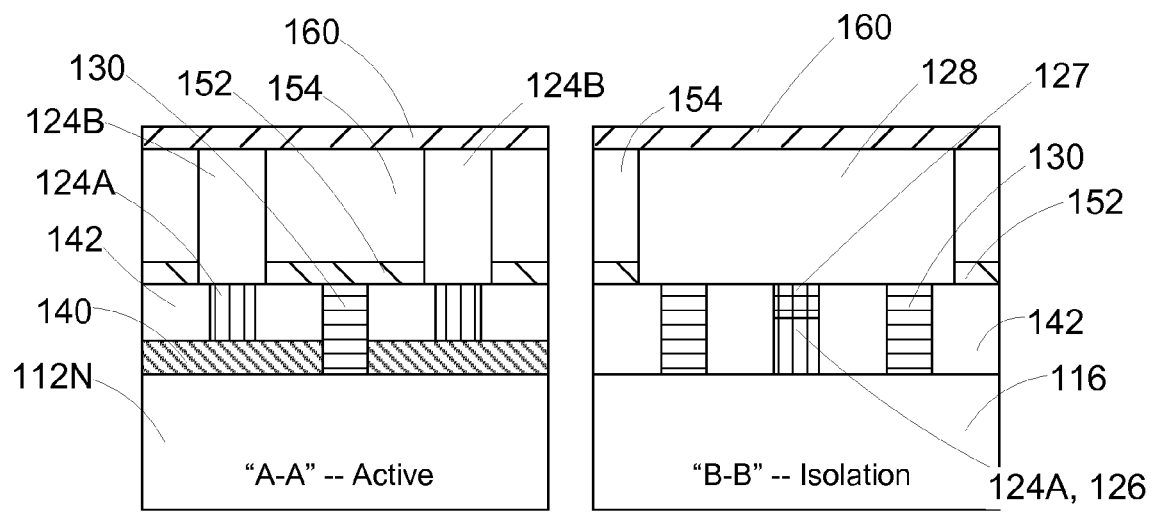
Figure 3M:
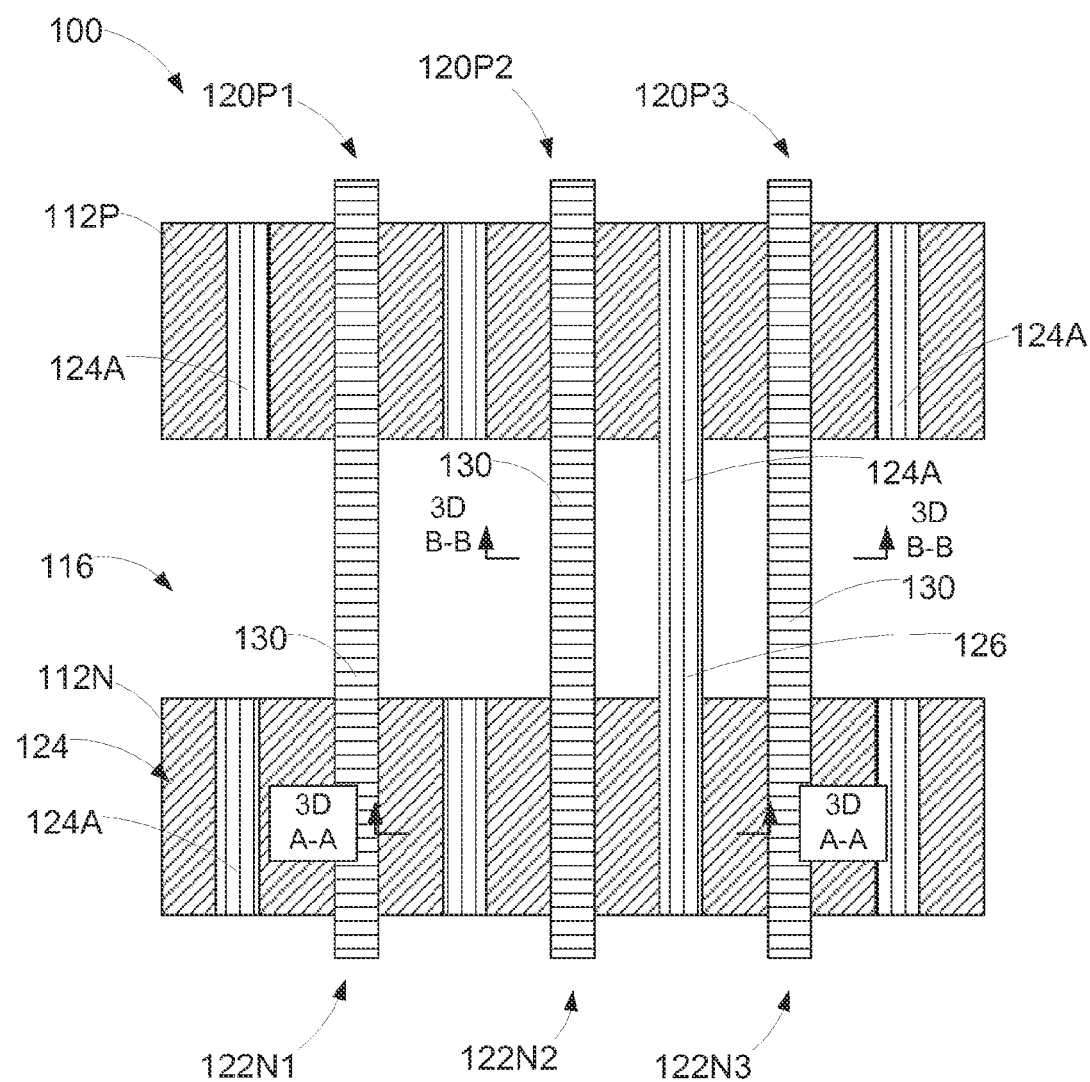
Figure 3N:
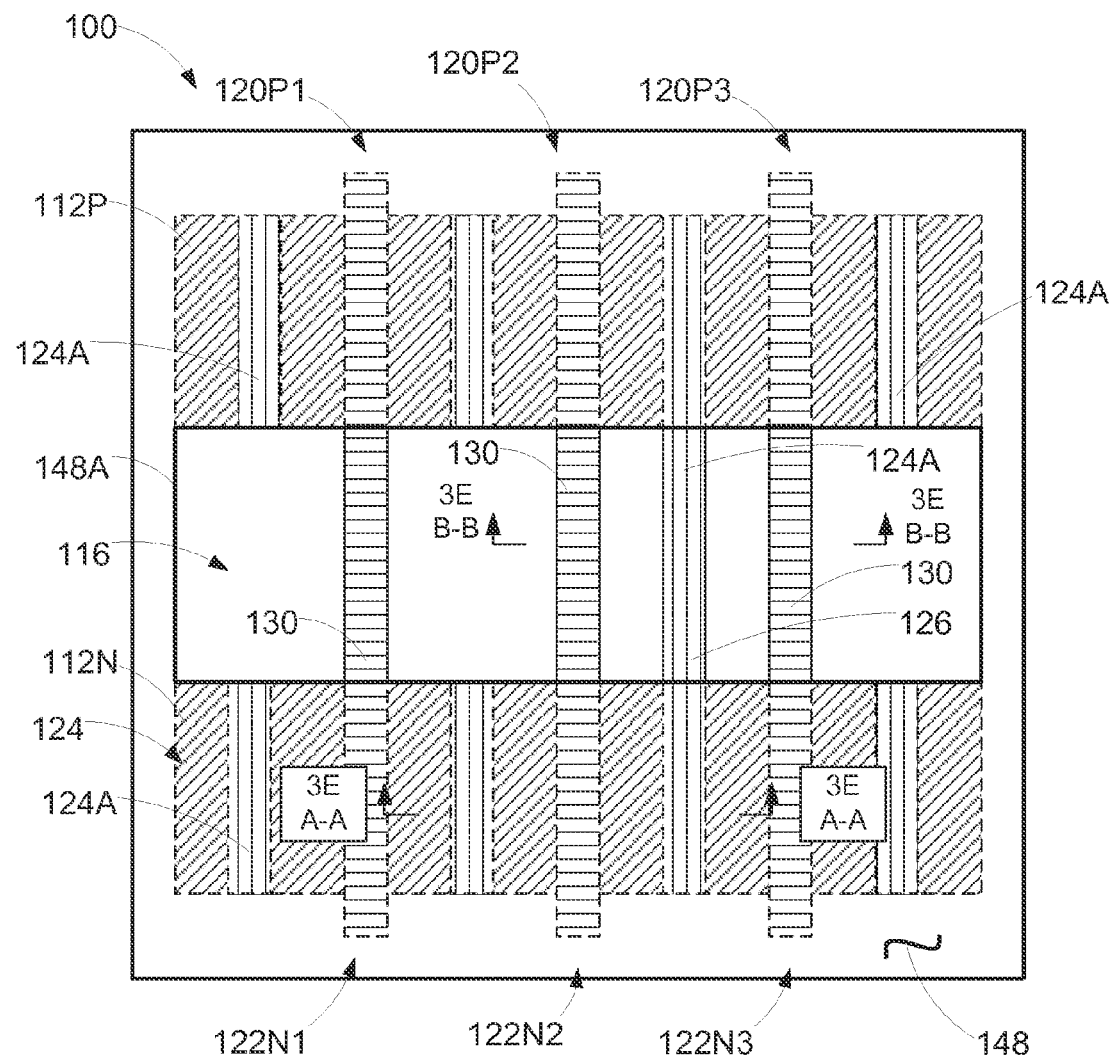
Figure 3O:
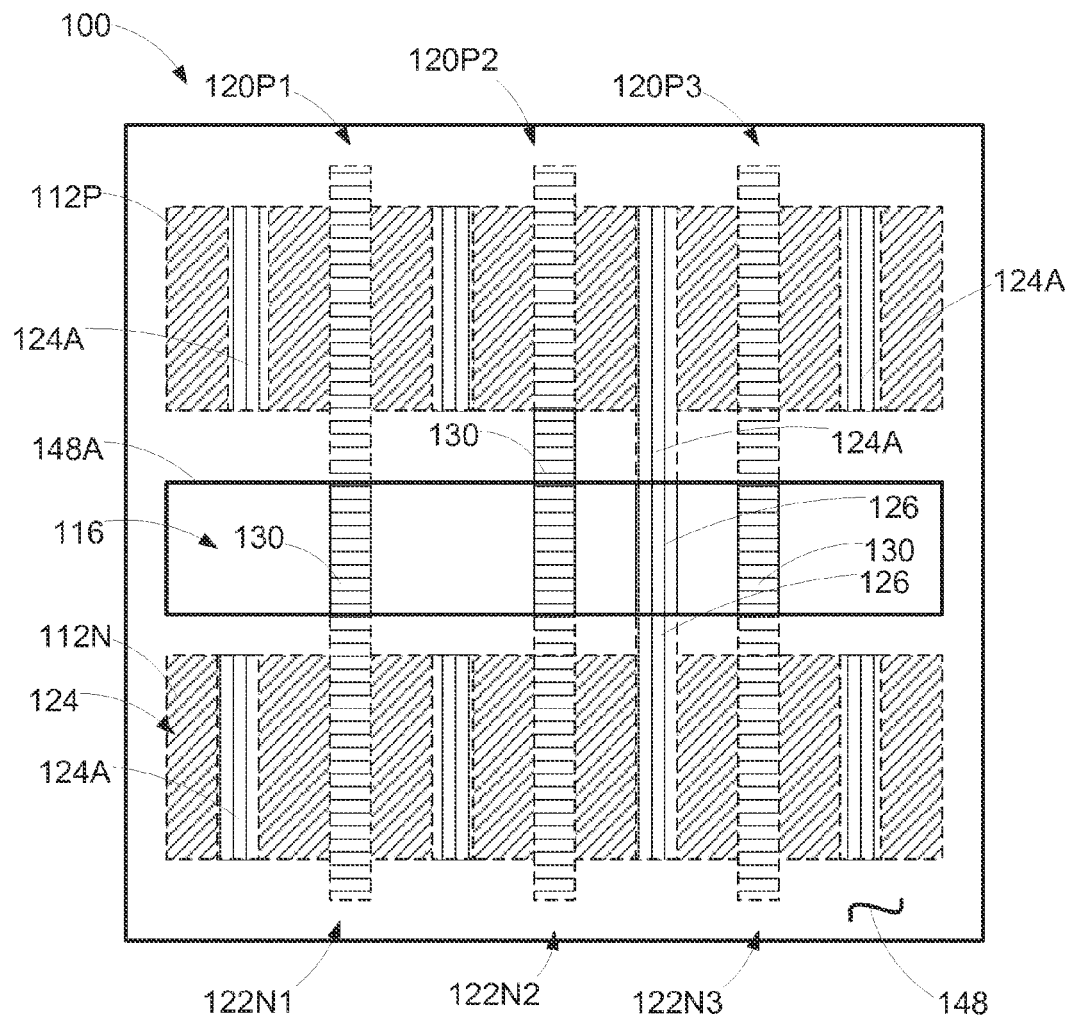

FIG. 3A-3O depict one illustrative process flow disclosed herein for forming conductive contacts on a semiconductor device 100. FIG. 3A is depiction of the device 100 at an intermediate state of fabrication. FIG. 3A is provided to show where various cross-sectional views shown in FIGS. 3B-3L are taken. More specifically, as indicated in FIG. 3A, the section "A-A" view is a cross-sectional view taken through the active region 112N depicting the formation of various structures associated with the illustrative transistor 122N2, which applies equally to all of the other transistor devices of the device 100. The section "B-B" in FIG. 3A is taken through the isolation region 116 and will show aspects of the formation of the gate structures 130 and the local interconnect structure 126 in the area above the isolation region 116.

FIG. 3B depicts the device 100 after several process operations have been performed. At the point of fabrication depicted in FIG. 3B, the gate structures 130 have been formed above the active regions 112P, 112N and above the isolation region 116. The active regions 112P, 112N are defined in a semiconducting substrate by the illustrative isolation region 116. The isolation region 116 may be comprised of a variety of materials, e.g., silicon dioxide, and it may be formed using a variety of known techniques. The substrate may take the form of a silicon-on-insulator (SOI) substrate that is comprised of a bulk substrate, a buried insulation layer (a so-called BOX layer) and an active layer positioned above the box layer. In such an embodiment, the active regions 112P, 112N would be formed in the active layer. The substrate may also be in bulk form. The substrate may also be made of materials other than silicon. Thus, the terms substrate or semiconducting substrate as used herein and in the appended claims should not be considered as limited to any particular configuration or material.

In the depicted example, the device 100 comprises a plurality of common gate structures 130 that are positioned above both of the active regions 112P, 112N and they each span the isolation region 116 positioned between the active regions 112P, 112N. As will be appreciated by one skilled in the art after a complete reading of the present application, the gate structures 130 may be formed using a variety of different materials and by performing a variety of known techniques. For example, the gate insulation layer in such a gate structure 130 may be comprised of a variety of different insulating materials, e.g., silicon dioxide, a so-called high-k insulating material (k value greater than 10), etc. The gate electrode in such a gate structure 130 may be comprised of polysilicon or it may contain at least one metal layer. The gate structures 130 of the various transistors may be made using so-called "gate first" or "gate last" (i.e., replacement gate) techniques. Thus, the presently disclosed inventions should not be considered as limited to any particular materials of construction for the gate structures 130 nor the manner in which such a gate structure 130 is formed.

With continuing reference to FIG. 3B, in the illustrative example depicted herein, schematically depicted raised source/drain regions 140 have been formed in the active regions, although all of the transistor devices may not have such raised source/drain regions 140. The raised source/drain regions 140 may be formed using traditional techniques, e.g., cavities may be formed in the substrate proximate the gate structure 130 and the cavities may thereafter be filled with an epitaxially grown semiconductor material that is doped in situ. Of course, the use of raised source/drain regions 140 on the transistor devices is not required to practice the inventions disclosed herein. Additionally, at the point of fabrication depicted in FIG. 3B, all required doped regions have been formed in the active regions, e.g., halo implant regions, extension implant regions, etc. One or more sidewall spacers (not shown) may be formed proximate the gate structures 130 during one or more of these operations. During the formation of the raised source/drain regions 140, the isolation region 116 may be masked. FIG. 3B also reflects the formation of a layer of insulating material 142 above both the active region 112N and the isolation region 116. The layer of insulating material 142 may be comprised of a variety of different material, e.g., silicon dioxide, and it may be formed by performing a variety of known processes, e.g., a chemical vapor deposition (CVD) process. FIG. 3B depicts the device 100 after one or more chemical mechanical polishing (CMP) processes have been performed to planarize the surface of the device 100 above both the active region 112N and the isolation region 116.

Next, as shown in FIG. 3C, a plurality of openings 144 are formed in the layer of insulating material 142 using known photolithography and etching tools and techniques. The openings 144 are formed so as to permit formation of lower level source/drain contacts 124A to the underlying source/drain regions 140. The opening 144 formed above the isolation region 116 permits the formation of the lower level source/drain contact 124A that will serve as the local interconnect structure 126, as described more fully below. The size and shape of the openings 144 may vary depending upon the particular application. In one illustrative embodiment, the openings define line-type features that extend for the full transistor width, but such a configuration is not required to practice the inventions disclosed herein.

As shown in FIG. 3D, the next process operation involves the formation of a plurality of conductive lower level source/drain contacts 124A and the lower level source/drain contact 124A that will serve as the local interconnect structure 126 in the openings 144. In one illustrative embodiment, the lower level source/drain contacts 124A and the local interconnect structure 126 may be formed by forming a conductive material, such as a metal like copper, aluminum or tungsten, above the device 100 such that the conductive material initially overfills the openings 144. Thereafter, one or more CMP processes is performed to remove any excess amounts of the conductive material positioned outside of the openings 144 to thereby form the lower level source/drain contacts 124A and the local interconnect structure 126 shown in FIG. 3D. In some cases, the formation of the lower level source/drain contacts 124A and the local interconnect structure 126 may involve formation of one or more barrier liner layers, but such liner layers are not depicted in the drawings so as not to obscure the inventions disclosed herein. FIG. 3M is a simplistic plan view depicting portions of the device 100 at the point in the process flow corresponding to the cross-sectional views depicted in FIG. 3D.

Next, as shown in FIG. 3E, an illustrative patterned hard mask layer 148 is formed that covers the active region 112N and exposes the isolation region 116. The patterned hard mask layer 148 may be comprised of a variety of different materials, e.g., silicon nitride. The patterned hard mask layer 148 may be formed by depositing a layer of the hard mask material and thereafter patterning the hard mask material layer using known photolithography and etching techniques. FIG. 3N is a simplistic plan view depicting portions of the device 100 at the point in the process flow corresponding to the cross-sectional views depicted in FIG. 3E. Note that the patterned hard mask layer 148 has an opening 148A that exposes approximately the entire length of the local interconnect structure 126 that spans across the isolation region 116 between the two spaced-apart active regions 112P, 112N.

Then, as shown in FIG. 3F, a wet or dry etching process is performed to remove a portion of the lower level source/drain contact 124A in the area above the isolation region 116, i.e., the portion of lower level source/drain contact 124A that serves as part of the local interconnect structure 126. This etching process results in the formation of a recess 150 above the remaining portion of the local interconnect structure 126. The depth of the recess 150 may vary depending upon the particular application, e.g., 30-40 nm. In one illustrative embodiment, the etching process used to form the recess 150 may be a timed wet etching process.

Next, as shown in FIG. 3G, a layer of insulating material 127 is blanket-deposited across the device 100 such that it overfills the recess 150 above the remaining portion of the local interconnect structure 126. The layer of insulating material 127 may be comprised of a variety of different materials, e.g., silicon nitride, silicon dioxide, and it may be formed using a variety of deposition processes, e.g., CVD, etc. In the illustrative example depicted herein, the insulating material 127 is formed above the local interconnect structure 126 over the entire span of the isolation region 116. However, as will be appreciated by one skilled in the art after a complete reading of the present application, in some applications the insulating material 127 may not cover the local interconnect structure 126 for the entire span of the isolation region 116. For example, in some applications, only the portions of the local interconnect structure 126 that are deemed close enough to the gate contact 128 to create a potential problem may be covered with the insulating material 127. In such a situation, portions of the local interconnect structure 126 may be masked during the etching process that is performed to define the recess 150 shown in FIG. 3F. FIG. 3O is a simplistic plan view depicting portions of the device 100 in the situation where the patterned hard mask layer 148 has an opening 148A that exposes less that the entire length of the local interconnect structure 126 that spans across the isolation region 116 between the two spaced-apart active regions 112P, 112N.

Thereafter, as shown in FIG. 3H, one or more CMP processes is performed to remove any excess amounts of the layer of insulating material 127 positioned outside of the recess 150 and to remove the patterned hard mask layer 148 from above the active region 112N. The insulating material 127 will serve to insulate the remaining portions of the local interconnect structure 126 from the gate contact 128.

Next, as shown in FIG. 3I, an etch stop layer 152 and a layer of insulating material 154 are blanket deposited above the device 100. The layers 152, 154 may be comprised of a variety of different insulating material, and the thickness of such layers may vary depending upon the particular application. For example, the etch stop layer may be comprised of silicon nitride and the layer of insulating material 154 may be comprised of silicon dioxide or a low-k material (k value less than 3.5). The layers 152, 154 may be formed using a variety of deposition processes, e.g., CVD, etc.

Next, as shown in FIG. 3J, one or more etching processes are performed to define a plurality of openings in the layers 152, 154 through a patterned mask layer (not shown), such as a patterned photoresist mask. More specifically, a plurality of openings 156 formed over the active region 112N expose the lower level source/drain contact 124A, while an opening 158 formed over the isolation region 116 exposes the gate electrodes of the gate structures 130.

Then, as shown in FIG. 3K, the next process operation involves the formation of a plurality of upper level source/drain contacts 124B above the active region 112N that are conductively coupled to the lower level source/drain contacts 124A, and the formation of a gate contact 128 above the isolation region 116 that is conductively coupled to the gate electrodes of the gate structures 130. As can be seen in FIG. 3K, the insulating material 127 insulates the remaining portions of the local interconnect structure 126 from the gate contact 128, thereby eliminating the potential problem of an electrical short. In one illustrative embodiment, the upper level source/drain contact 124B and the gate contact 128 may be formed by forming a conductive material such as a metal like copper, aluminum or tungsten above the device 100 such that the conductive material initially overfills the openings 156, 158. Thereafter, one or more CMP processes is performed to remove any excess amounts of the conductive material positioned outside of the openings 156, 158 to thereby form the upper level source/drain contacts 124B and the gate contact 128. In some cases, the formation of the upper level source/drain contacts 124B and the gate contact 128 may involve formation of one or more barrier liner layers, but such liner layers are not depicted in the drawings so as not to obscure the inventions disclosed herein.

Next, as shown in FIG. 3L, an etch stop layer 160 is formed above the dual level source/drain contacts 124A, 124B and the gate contact 128 of the device 100. The etch stop layer 160 may be made of the same materials as described previously for the etch stop layer 152 and it may be formed using the same techniques. Thereafter, various metallization layers, such as a so-called metal 1 layer, are formed above the device 100 using traditional materials and techniques. The dual level source/drain contacts 124A, 124B and the gate contact 128 of the device 100 are conductively coupled to such metallization layers using traditional techniques, e.g., conductive vias.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a local interconnect structure between first and second active regions that are separated by an isolation region, wherein each of said active regions has at least one transistor device formed therein and thereon, the method comprising:
   forming a plurality of source/drain contacts that are each conductively coupled to a source/drain region of one of said at least one transistor device, wherein at least one of said source/drain contacts is a local interconnect structure that spans the isolation region and is conductively coupled to a first source/drain region in said first active region and to a second source/drain region in said second active region;
   after forming said plurality of source/drain contacts, forming a patterned mask layer that covers an entirety of said first and second active regions and exposes at least a portion of said local interconnect structure positioned above said isolation region;
   performing an etching process through said patterned mask layer to remove a portion of said local interconnect structure, said etching process defining a recess positioned above a remaining portion of said local interconnect structure; and
   forming an insulating material in said recess.

2. The method of claim 1, wherein forming said plurality of source/drain contacts comprises forming a plurality of dual level source/drain contacts comprised of a lower level source/drain contact and an upper level source/drain contact that is conductively coupled to said lower level source/drain contact, wherein said local interconnect structure is comprised of one of said lower level source/drain contacts.

3. The method of claim 1, further comprising forming a gate contact that is conductively coupled to at least one gate electrode of said at least one transistor device, wherein at least a portion of said gate contact is positioned above said insulating material in said recess that is positioned above said remaining portion of said local interconnect structure.

4. The method of claim 1, wherein said recess spans the entirety of said isolation region.

5. The method of claim 1, wherein said etching process is a timed wet etching process.

6. The method of claim 1, wherein said source/drain contacts are line-type features.

7. The method of claim 1, wherein said source/drain contacts are comprised of aluminum, tungsten or copper.

8. The method of claim 1, wherein said patterned mask layer is a patterned hard mask layer.

9. The method of claim 1, further comprising forming a shared gate electrode structure that is positioned above said first and second active regions and said isolation region, said shared gate electrode serving as a gate electrode for said at least one transistor device above said first and second active regions.

10. A method of forming a local interconnect structure between first and second active regions that are separated by an isolation region, wherein each of said active regions has at least one transistor device formed therein and thereon, the method comprising:
    forming a plurality of source/drain contacts that are each conductively coupled to a source/drain region of one of said at least one transistor device, wherein said source/drain contacts are line-type features and wherein at least one of said source/drain contacts is a local interconnect structure that spans the isolation region and is conductively coupled to a first source/drain region in said first active region and to a second source/drain region in said second active region;
    after forming said plurality of source/drain contacts, forming a patterned mask layer that covers an entirety of said first and second active regions and exposes at least a portion of said local interconnect structure positioned above said isolation region;
    performing an etching process through said patterned mask layer to remove a portion of said local interconnect structure, said etching process defining a recess positioned above a remaining portion of said local interconnect structure;
    forming an insulating material in said recess; and
    forming a gate contact that is conductively coupled to at least one gate electrode of said at least one transistor device, wherein at least a portion of said gate contact is positioned above said insulating material in said recess that is positioned above said remaining portion of said local interconnect structure.

11. The method of claim 10, wherein said recess spans the entirety of said isolation region.

12. The method of claim 10, wherein said etching process is a timed wet etching process.

13. A method of forming a local interconnect structure between first and second active regions that are separated by an isolation region, wherein each of said active regions has at least one transistor device formed therein and thereon, the method comprising:
    forming a plurality of source/drain contacts that are each conductively coupled to a source/drain region of one of said at least one transistor device, wherein at least one of said source/drain contacts is a local interconnect structure that spans the isolation region and is conductively coupled to a first source/drain region in said first active region and to a second source/drain region in said second active region;
    after forming said plurality of source/drain contacts, forming a patterned hard mask layer that covers an entirety of said first and second active regions and exposes the entirety of said local interconnect structure that is positioned above said isolation region;
    performing a timed etching process through said patterned mask layer to remove a portion of said local interconnect structure, said etching process defining a recess positioned above a remaining portion of said local interconnect structure, said recess spanning the entirety of said isolation region;
    forming an insulating material in said recess; and
    forming a gate contact that is conductively coupled to at least one gate electrode of said at least one transistor device, wherein at least a portion of said gate contact is positioned above said insulating material in said recess that is positioned above said remaining portion of said local interconnect structure.

14. A method of forming a local interconnect structure between first and second active regions that are separated by an isolation region, wherein each of said active regions has at least one transistor device formed therein and thereon, the method comprising:

forming a plurality of shared gate electrode structures that are positioned above said first and second active regions and span said isolation region, each of said shared gate electrode structures serving as a gate electrode structure for a transistor formed in and above said first active region and as a gate electrode structure for a transistor formed in and above said second active region;

forming a plurality of source/drain contacts that are each conductively coupled to a source/drain region of one of said at least one transistor device, wherein at least one of said source/drain contacts is a local interconnect structure that spans the isolation region and is conductively coupled to a first source/drain region in said first active region and to a second source/drain region in said second active region;

after forming said plurality of source/drain contact, forming a patterned hard mask layer that covers an entirety of said first and second active regions and exposes only a portion of said local interconnect structure that is positioned above said isolation region;

performing a timed etching process through said patterned mask layer to remove a portion of said local interconnect structure, said etching process defining a recess positioned above a remaining portion of said local interconnect structure, said recess spanning less than the entirety of said isolation region;

forming an insulating material in said recess; and forming a gate contact above said isolation region that is conductively coupled to at least one of said shared gate electrode structures, wherein at least a portion of said gate contact is positioned above said insulating material in said recess that is positioned above said remaining portion of said local interconnect structure.

* * * * *